(12) United States Patent
Zhou et al.

(10) Patent No.: US 8,259,464 B2
(45) Date of Patent: Sep. 4, 2012

(54) WAFER LEVEL PACKAGE (WLP) DEVICE HAVING BUMP ASSEMBLIES INCLUDING A BARRIER METAL

(75) Inventors: Tiao Zhou, Carrollton, TX (US); Arkadii V. Samoilov, Saratoga, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 77 days.

(21) Appl. No.: 12/822,326

(22) Filed: Jun. 24, 2010

(65) Prior Publication Data
US 2011/0317385 A1 Dec. 29, 2011

(51) Int. Cl.
*H05K 7/12* (2006.01)
*H01L 21/44* (2006.01)
(52) U.S. Cl. ........ 361/771; 361/760; 361/807; 361/809; 257/737; 257/738; 257/E21.069; 438/612; 438/613; 438/626
(58) Field of Classification Search .......... 361/760–767, 361/732, 756, 715–724, 770–774, 807–809; 257/692, 686, 698, 732–739, 758, 762, E21.509, 257/E23.06, E23.069, E23.141; 438/106–118, 438/612–626; 174/254–267; 29/825–852
See application file for complete search history.

(56) References Cited

U.S. PATENT DOCUMENTS

| | | | | |
|---|---|---|---|---|
| 7,335,986 B1 * | 2/2008 | Paek et al. | | 257/723 |
| 7,358,174 B2 * | 4/2008 | Mis | | 438/612 |
| 7,582,556 B2 * | 9/2009 | Lin et al. | | 438/626 |
| 2005/0176233 A1 * | 8/2005 | Joshi et al. | | 438/613 |
| 2011/0101521 A1 * | 5/2011 | Hwang et al. | | 257/737 |
| 2011/0193219 A1 * | 8/2011 | Lai et al. | | 257/737 |
| 2011/0227219 A1 * | 9/2011 | Alvarado et al. | | 257/738 |
| 2011/0254151 A1 * | 10/2011 | Lin et al. | | 257/737 |
| 2011/0278716 A1 * | 11/2011 | Hsu et al. | | 257/737 |

* cited by examiner

*Primary Examiner* — Michail V Datskovskiy
(74) *Attorney, Agent, or Firm* — Advent IP, P.C., L.L.O.

(57) ABSTRACT

WLP semiconductor devices include bump assemblies that have a barrier layer for inhibiting electromigration within the bump assemblies. In an implementation, the bump assemblies include copper posts formed on the integrated circuit chips of the WLP devices. Barrier layers formed of a metal such as nickel (Ni) are provided on the outer surface of the copper posts to inhibit electromigration in the bump assembly. Oxidation prevention caps formed of a metal such as tin (Sn) are provided over the barrier layer. Solder bumps are formed over the oxidation prevention caps. The oxidation prevention caps inhibit oxidation of the barrier layer during fabrication of the bump assemblies.

20 Claims, 6 Drawing Sheets

WAFER LEVEL PACKAGE (WLP) DEVICE HAVING BUMP ASSEMBLIES INCLUDING A BARRIER METAL

BACKGROUND

Traditional fabrication processes used in the manufacture of semiconductor devices employ microlithography to pattern integrated circuits onto a circular wafer formed of a semiconductor such as silicon or the like. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable and more environmentally-friendly packages. For example, chip-scale packaging technologies have been developed that employ direct surface mountable packages having a surface area that is no greater than 1.2 times the area of the integrated circuit chip. Wafer level packaging is an emerging chip-scale packaging technology that encompasses a variety of techniques whereby integrated circuit chips are packaged at wafer level, prior to singulation. Wafer level packaging extends the wafer fabrication processes to include device interconnection and device protection processes. Consequently, wafer level packaging streamlines the manufacturing process by allowing for the integration of wafer fabrication, packaging, testing, and burn-in processes at the wafer level.

SUMMARY

Wafer level package (WLP) devices are described that include bump assemblies which comprise a barrier layer configured to inhibit electromigration within the bump assemblies. In an implementation, the bump assemblies include copper posts formed on the integrated circuit chips of the WLP devices. A barrier layer formed of a metal such as nickel (Ni) is applied to the outer surfaces of the copper posts to inhibit electromigration in the bump assemblies. An oxidation prevention cap formed of a metal such as tin (Sn) is applied over the barrier layer. The oxidation prevention cap inhibits oxidation of the barrier layer during fabrication of the bump assemblies and functions as a sacrificial layer that may be ground during epoxy grinding so that the thickness of the barrier layer is not affected.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
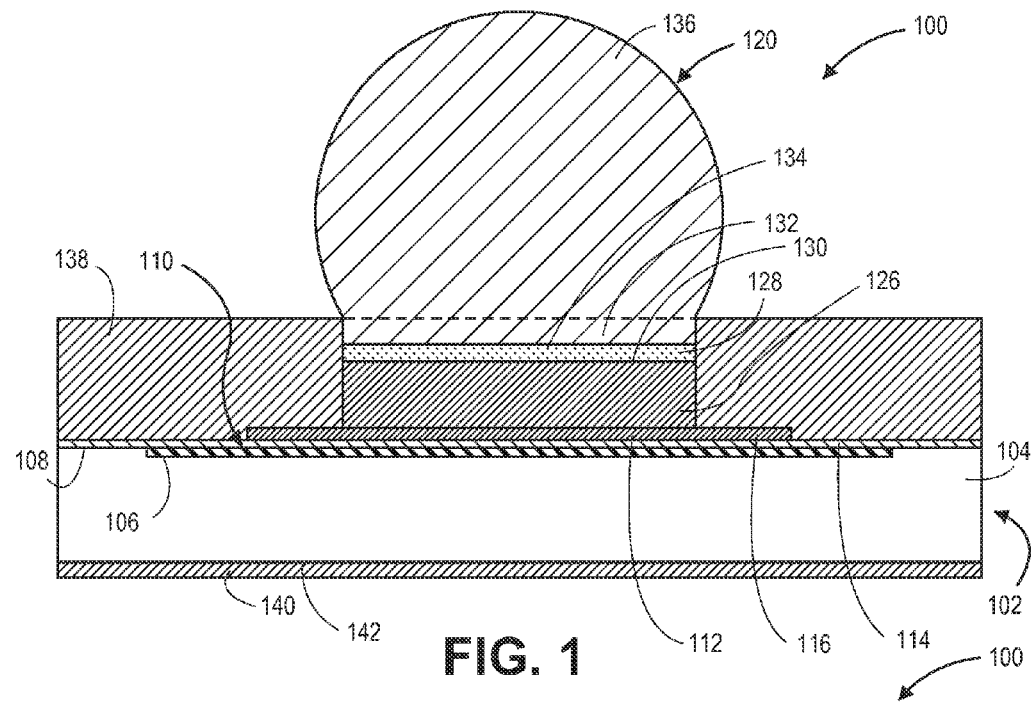
FIG. 1 is a diagrammatic partial cross-sectional side elevation view illustrating a WLP device in accordance with an example implementation of the present disclosure.

Electromigration mitigation is an important design consideration in the manufacture of WLP devices. Electromigration involves the gradual transport of the metal atoms of a conductor, such as copper, due to the current flowing through the conductor. This transport of atoms can cause voids, cracks, or other defects to form within the conductor. In particular, electromigration within the bump assemblies (e.g., solder joints) of WLP devices can lead to premature failure of the bump assemblies reducing the reliability of the WLP device.

Some WLP devices comprise bump assemblies that employ a copper (Cu) post structure, wherein the bump assemblies include copper posts deposited on the redistribution layer (RDL) pads, with solder bumps formed over the copper posts. Under conditions of high temperature and/or high current, electromigration can cause part of the copper post to dissolve into the solder of the bump assembly in the form of a copper-tin intermetallic compound (IMC). Cracks, voids, or other defects may form within this intermetallic compound, resulting in failure of the bump assembly.

To inhibit electromigration in the bump assemblies of WLP devices that employ a copper post structure, a barrier layer formed of nickel (Ni) may be applied to the outer surface of the copper posts so that the barrier layer becomes the wetting surface for the solder. Nickel has an electromigration reaction rate with the tin of the solder that is lower than that of the copper forming the copper posts. Thus, the application of the nickel barrier layer increases the electromigration life of the bump assemblies.

The application of a nickel barrier layer to bump assemblies having a copper post structure has however been found to significantly reduce the drop test (DT) reliability of the WLP devices. More specifically, the nickel barrier layer has typically been applied to the copper posts using an electroless plating process (electroless nickel). Consequently, phosphorus (P) is intrinsically present in the nickel of the barrier layer. This phosphorus can impede bonding of solder to the nickel barrier layer resulting in a weakened connection and poor drop test reliability performance.

To avoid such phosphorus-related weakness in the bump assemblies, the nickel barrier layer may be applied using an electrolytic plating process (electrolytic nickel). However, the thickness of the electrolytic nickel can be difficult to control since the plating processes used to form the copper posts can exhibit large variation. Thus, nickel may be ground away during epoxy grinding processes reducing the effectiveness of the barrier layer. Moreover, where electrolytic nickel is employed, oxidation can occur in the surface of the barrier layer prior to application the solder forming the solder bumps. This oxidation, which is not easily removed by conventional techniques (e.g., by application of flux to the surface of the barrier layer), may cause excessive solder voiding at the wetting surface of the solder, impeding the formation of a good bond between the solder and the nickel barrier layer.

Accordingly, techniques are described for fabricating WLP devices having bump assemblies that employ copper post structure configured to improve electromigration reliability while maintaining adequate drop test reliability. In one or more implementations, a barrier layer formed of a metal such as nickel (Ni) using an electrolytic plating process is applied to the copper posts of the bump assemblies to inhibit electromigration in the solder of the solder bump assemblies. Oxidation prevention caps formed of a metal such as tin (Sn) are then applied over the barrier layer. During fabrication of the WLP devices, the oxidation prevention caps inhibit oxidation of the barrier layer prior to application of the solder forming the solder bumps of the bump assemblies so that a strong interconnection is provided between the solder and the underlying barrier layer. The oxidation prevention caps also function as a sacrificial layer that may be ground during epoxy grinding so that the thickness of the barrier layer is not affected. In this manner, the resulting bump assemblies provide good electromigration mitigation performance, due to addition of an adequate barrier layer, without sacrificing drop test reliability.

Example Implementations

FIG. 1 illustrates a section of a WLP device 100 in accordance with an example implementation of the present disclosure. As shown, the WLP device 100 includes an integrated circuit chip 102 comprised of a substrate 104 having one or more integrated circuits 106 formed in a surface 108 of the substrate 104. A redistribution structure 110 is provided on the surface 108 over the integrated circuits 106. The redistribution structure 110 redistributes peripheral RDL pads of the integrated circuits 106 to one or more area arrays of RDL pads 112 that are deployed over the surface of the integrated circuit chip 102. In the implementation shown, the redistribution structure 110 includes a passivation layer 114 and a redistribution layer 116. The passivation layer 114 is formed over the integrated circuits 106 to separate the integrated circuits 106 from subsequent conductive layers (e.g., the redistribution layer 116). The passivation layer 114 may be formed of a polymer material such as a polyimide resin, a dielectric material such a benzocyclobutene polymer (BCB), silicon dioxide ($SiO_2$), or the like. The redistribution layer 116 is patterned to form the RDL pads 112 and to provide electrical interconnection of the peripheral RDL pads of the integrated circuits 106 to the RDL pads 112. In embodiments, the redistribution layer 116 is formed of copper (Cu). However, it is contemplated that the redistribution layer 116 may be formed of other metals such as aluminum (Al), other conductive materials and so on.

Figure 2:
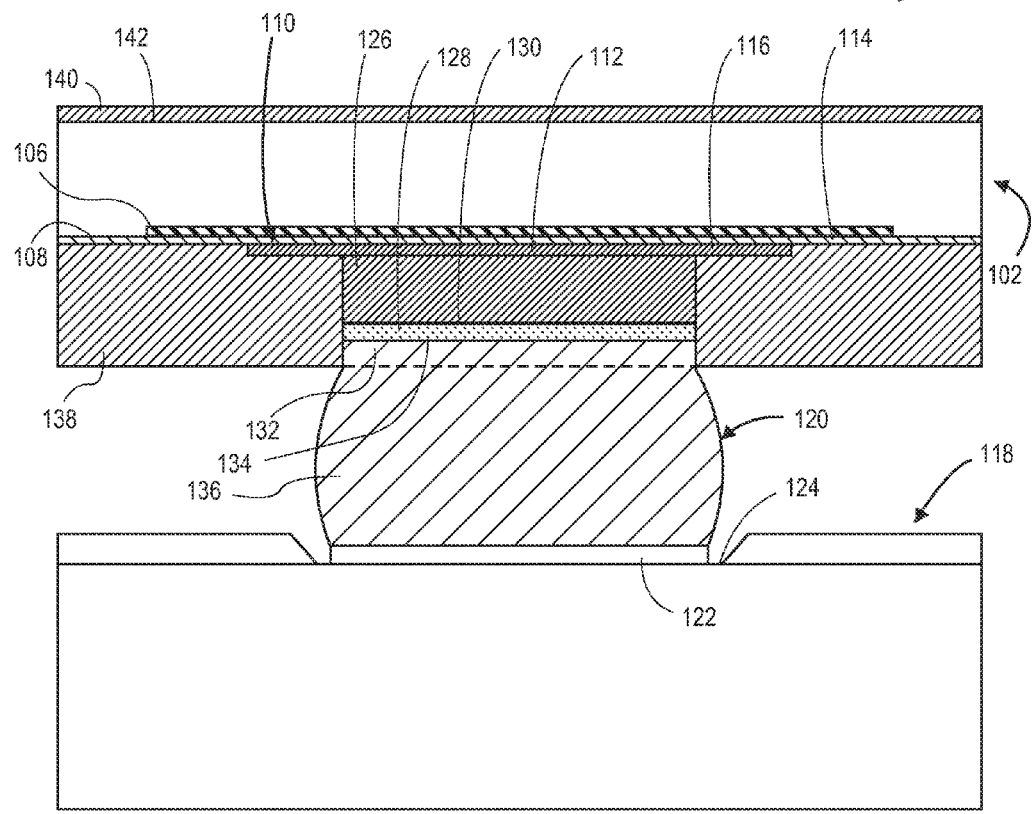
FIG. 2 is a diagrammatic partial cross-sectional elevation view illustrating the WLP device of FIG. 1 mounted to the printed circuit board of an electronic device.

The configuration of the redistribution structure 110 and/or the number and configuration of RDL pads 112 provided by the redistribution structure 110 may vary depending on the complexity and configuration of the integrated circuits 106, the size and shape of the integrated circuit chip 102, and so forth. The RDL pads 112 provide electrical contacts through which the integrated circuits 106 are interconnected to external components such as printed circuit boards. FIG. 2 illustrates the WLP device 100 of FIG. 1 mounted to the printed circuit board 118 of an electronic device.

The WLP device 100 includes one or more bump assemblies 120 to furnish mechanical and/or electrical interconnection between the RDL pads 112 and corresponding pads 122 formed on the surface 124 of the printed circuit board 118. As shown, the WLP device 100 comprises bump assemblies 120 that employ a copper (Cu) post structure. Thus, the bump assemblies 120 employ copper posts 126 formed on the RDL pads 112. In an example, the copper posts 126 may have a thickness of about 45 µm. However, the formation of copper posts 126 having a different thickness is contemplated. Moreover, in some embodiments, an adhesion/barrier/seed layer may be applied to the RDL pads 112 under the copper posts 126 to improve the reliability of the interconnect interface.

A barrier layer 128 is provided on the outer surfaces 130 of the copper posts 126. As previously described, the barrier layer 128 functions as a barrier to inhibit (e.g., eliminate, substantially reduce, or reduce) electromigration within the bump assembly 120. In embodiments, the barrier layer 128 is formed of electrolytic nickel (Ni) deposited over the outer surface 130 of the copper post 126 using a suitable electrolytic plating process. However, it is contemplated that the barrier layer 128 may be formed of other metals such as palladium (Pd). As shown, the barrier layer 128 may at least substantially cover the outer surface 130 of the copper posts 126 and may have a thickness sufficient to inhibit electromigration in the bump assemblies 120. In an example, the barrier layer 128 may have a thickness of about 10 µm. However, the application of barrier layers 128 having a different thickness is contemplated.

An oxidation prevention cap 132 is provided over the barrier layer 128. As shown, the oxidation prevention cap 132 may at least substantially cover the outer surface 134 of the barrier layer 128 to inhibit oxidation of the barrier layer 128 during fabrication of the bump assemblies 120, as discussed in more detail herein below. In one or more embodiments, the oxidation prevention cap 132 is formed of tin (Sn). However, it is contemplated that in some embodiments the oxidation prevention cap 132 may be formed of a tin alloy, which may include other metals such as silver (Ag), copper (Cu), and so on.

A solder bump 136 is formed over the oxidation prevention cap 132. In one or more embodiments, the solder bump 136 may be fabricated of a lead-free solder such as a tin-silver-copper (Sn—Ag—Cu) alloy solder (i.e., SAC), a tin-silver (Sn—Ag) alloy solder, a tin-copper (Sn—Cu) allow solder, and so on. For example, solder bumps 136 may have a variety of SAC compositions. In an example, the solder bumps 136 may be a SAC305 (Sn3.0Ag0.5Cu) alloy solder, a SAC405 (Sn3.8Ag0.8Cu) alloy solder. Other examples are possible. Moreover, it is contemplated that tin-lead (PbSn) solders may be used. Example processes for forming the bump assemblies 120 using wafer level packaging techniques are described in more detail below.

In FIGS. 1 and 2, the oxidation prevention cap 132 and the solder bump 136 are shown as distinct components or layers of the bump assembly 120 illustrated. However, it will be appreciated that the solder 138 of the solder bump is comprised of a large proportion of tin. Thus, in some instances, the tin of the oxidation prevention cap 132 may become at least partially consumed in a nickel-tin intermetallic compound (IMC) formed between the solder of the solder bump 136 and the barrier layer 128, and amalgamated with the solder, following reflow. Consequently, it is contemplated that, in such instances, a distinct boundary may not be identifiable between the oxidation prevention cap 132 and the solder bump 136.

Epoxy (polyepoxide) 138 is applied over the redistribution structure 110 between the copper posts 126 to protect and insulate the redistribution structure 110, and to provide mechanical support to the copper posts 126, barrier layer 128, and oxidation prevention cap 132. A backside coating 140 is applied to the surface 142 of the integrated circuit chip 102 opposite the redistribution structure 110 to protect the integrated circuit chip 102 from chipping.

Example Fabrication Processes

Figure 3:
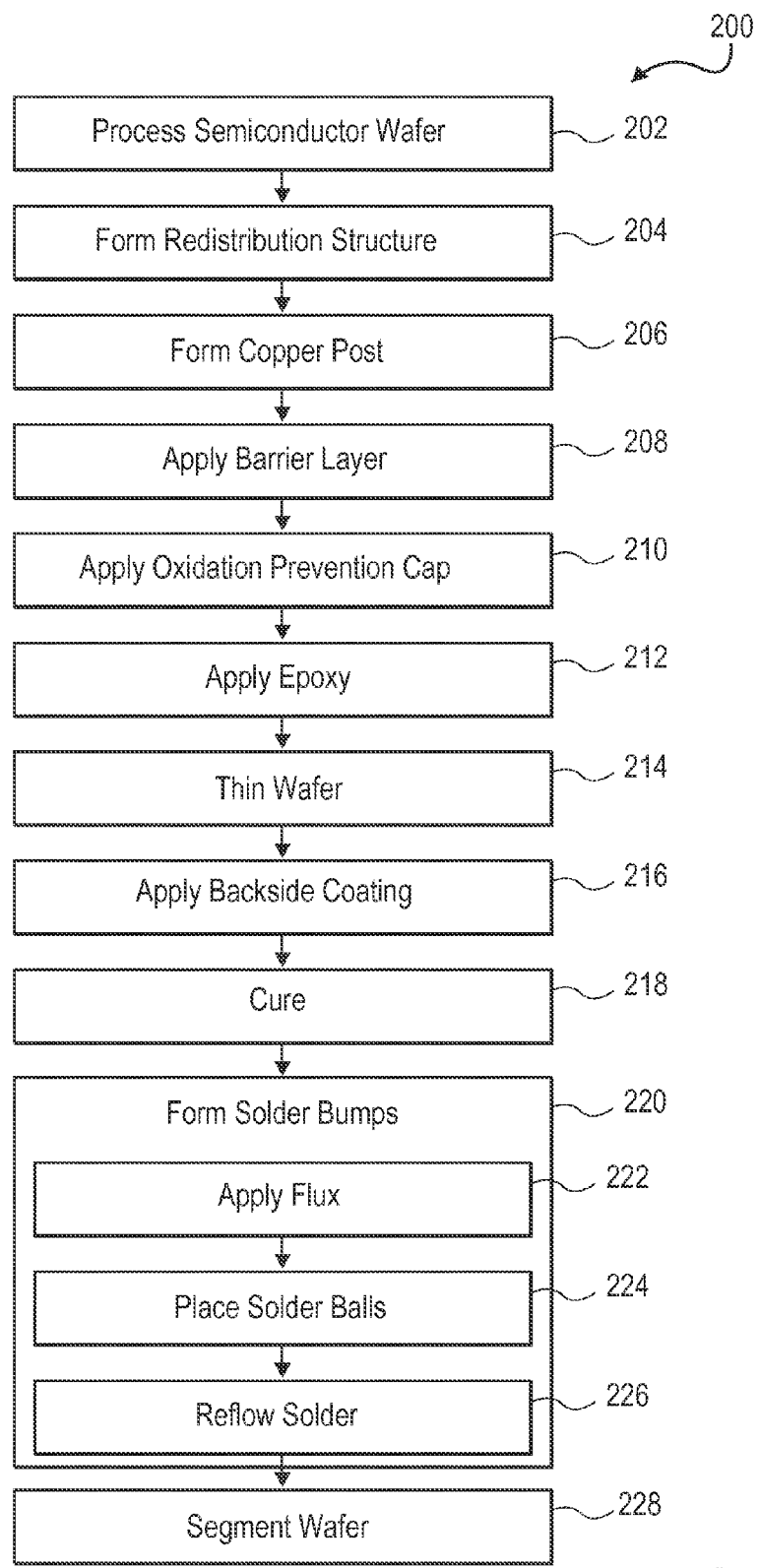
FIG. 3 is a flow diagram illustrating a process in an example implementation for fabricating WLP devices, such as the WLP device shown in FIG. 1.

FIG. 3 illustrates an example process 200 that employs wafer level packaging techniques to fabricate semiconductor devices, such as the WLP devices 100 shown in FIGS. 1 and 2. In the process 200 illustrated, bump assemblies having a copper (Cu) post structure are formed on a semi-conductor wafer prior to segmentation of the wafer. As shown, the semiconductor wafer is first processed (Block 202) to create integrated circuits in the surface of the wafer using microlithography techniques. A portion of an example semiconductor wafer 300 is illustrated in FIGS. 4A through 4K illustrating the formation of an example bump assembly 302. As shown, the semiconductor wafer 300, when processed, includes a substrate 304 having one or more integrated circuits 306 formed in a surface 308 of the substrate 304. The substrate 304 is configured to be segmented (diced) into a plurality of integrated circuit chips 310. In the implementation illustrated, the substrate 304 is fabricated of silicon. However, it is contemplated that the substrate 304 may instead be fabricated of other semiconductor materials such as germanium, gallium arsenide, silicon carbide, and so forth.

Figure 4A:
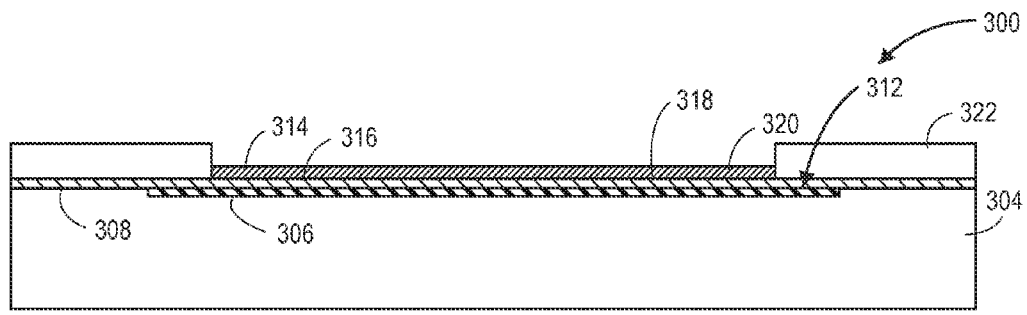
FIGS. 4A through 4K are diagrammatic partial cross-sectional side elevation views illustrating the fabrication of a WLP device, such as the device shown in FIG. 1, in accordance with the process shown in FIG. 3.

A redistribution structure is formed on the surface of the wafer (Block 204) over the integrated circuits. FIG. 4A illustrates the formation of an example redistribution structure 312. As shown, the redistribution structure 312 may have multiple layers that redistribute peripheral RDL pads of the integrated circuits 306 to RDL pads 314 that are deployed over the surface 316 of the semiconductor wafer 300. For example, in the implementation illustrated, the redistribution structure 312 is depicted as including a passivation layer 318 and a redistribution layer 320. The passivation layer 318 is formed over the integrated circuits 306 to separate the integrated circuits 306 from subsequent conductive layers such as the redistribution layer 320. In embodiments, the passivation layer 318 may be formed of a polymer material such as polyimide. However, it is contemplated that the passivation later may also be formed of other dielectric materials such as benzocyclobutene polymer (BCB), silicon dioxide ($SiO_2$), or the like. In an example, the passivation layer 318 may have a thickness of about 4 μm. However, the application of passivation layers 318 having a different thickness is contemplated.

The redistribution layer 320 is applied over the passivation layer 318. In embodiments, the redistribution layer 320 is formed of copper (Cu) that is plated over the passivation layer 318 using a suitable electroplating process. However, it is contemplated that the redistribution layer 320 may be formed of other conductive materials such as polysilicon, metals such as aluminum, and so on, applied using processes suitable to the material. The redistribution layer 320 is patterned to form the RDL pads 314 and to provide electrical interconnection of the peripheral bonding pads of the integrated circuits 306 to the RDL pads 314. For example, the electroplating process may employ a mask 322 applied to the surface of the wafer 300 to pattern the copper to form the RDL pads 314 and any other interconnect structures of the redistribution layer 320.

Figure 4B:
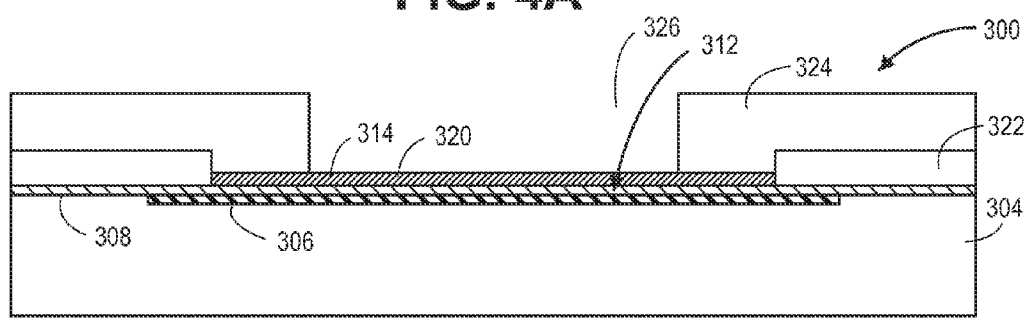
Figure 4C:
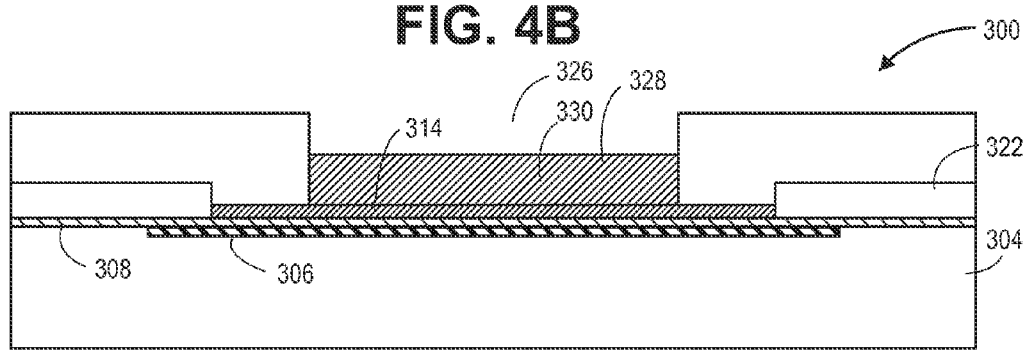

Copper (Cu) posts are then formed (Block 206) on the wafer over the RDL pads of the redistribution structure. For instance, as shown in FIG. 4B, a second mask 324 may be applied to the semiconductor wafer 300 over the redistribution structure 312. The second mask 324 includes apertures 326 formed over the RDL pads 314 of the redistribution layer 320 that are sized and shaped to facilitate formation of the copper posts 328 (see FIG. 4C). As shown, the second mask 324 may be formed over the first mask 322 used in the formation of the redistribution layer 320. However, it is contemplated that in some implementations, the first mask 322 may instead be removed prior to application of the second mask 324. In one or more embodiments, either or both of the masks 322, 324 may be formed of a photoresist applied to the semiconductor wafer 300 using a spincoating process and patterned using suitable photolithography techniques. However, it is contemplated that the masks 322, 324 can be formed of other materials using other processes. Copper 330 is deposited within the apertures 326 of the second mask 324 to form the copper posts 328 as shown in FIG. 4C. In one or more embodiments, the copper is plated onto the RDL pads 314 of the redistribution layer using a suitable electroplating process. However, it is contemplated that the copper may be deposited using other processes such as sputtering, and so on. In an example, the copper is plated to form copper posts 328 having a height of about 45 μm. However, the application of copper posts 328 having a different height is contemplated.

Figure 4D:
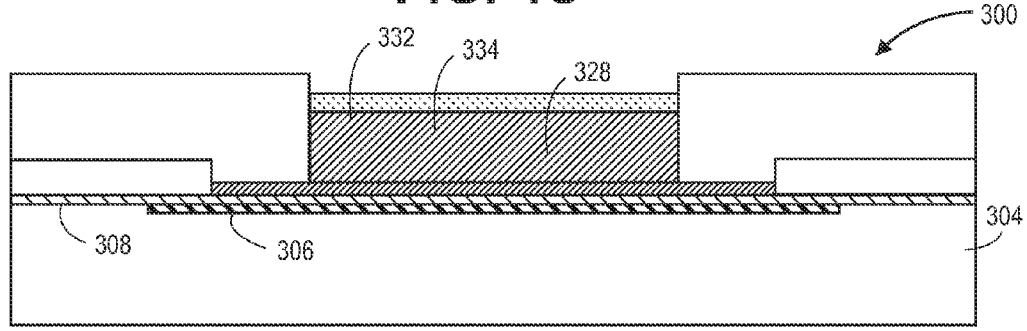

Next, a barrier layer is applied (Block 208) to the copper posts. As shown in FIG. 4D, the barrier layer 332 at least substantially covers the outer surface 334 of the illustrated copper post 328. In one or more embodiments, the barrier layer 332 is formed of electrolytic nickel (Ni) deposited within the apertures 326 formed in the second mask 324 over the outer surface 334 of the copper posts 328 utilizing a suitable electrolytic plating process. However, it is contemplated that in some embodiments, the barrier layer 128 may be formed of other metals such as Pladium, and so on. In an example, nickel is plated to form a barrier layer 332 having a thickness of about 10 μm. However, the application of barrier layers 332 having a different thickness is contemplated.

Figure 4E:
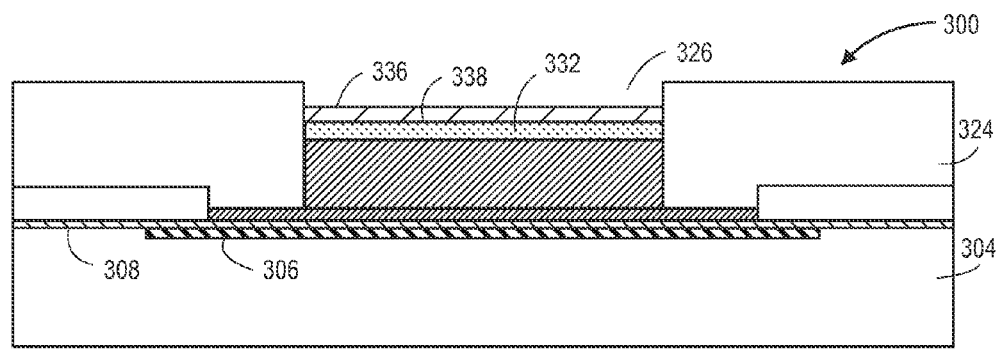

An oxidation prevention cap is then applied (Block 210) to the barrier layer over the copper posts. As shown in FIG. 4E, the oxidation prevention cap 336 may at least substantially cover the outer surface 338 of the barrier layer 332 to inhibit oxidation of the barrier layer 332 during the remaining fabrication operations performed on the semiconductor wafer 300. In one or more embodiments, the oxidation prevention cap 336 is formed of tin (Sn) deposited on the outer surface 338 of the barrier layer 332 using a suitable electroplating plating process. However, it is contemplated that in some embodiments the oxidation prevention cap 336 may be formed of a tin alloy, which may include other metals such as silver (Ag), copper (Cu), and so on, applied using processes suitable for the material applied. In an example, tin may be plated to form an oxidation prevention cap 336 having a thickness of about 15 μm (prior to epoxy grinding). However, the application of oxidation prevention caps 336 having a different thickness is contemplated.

Figure 4F:
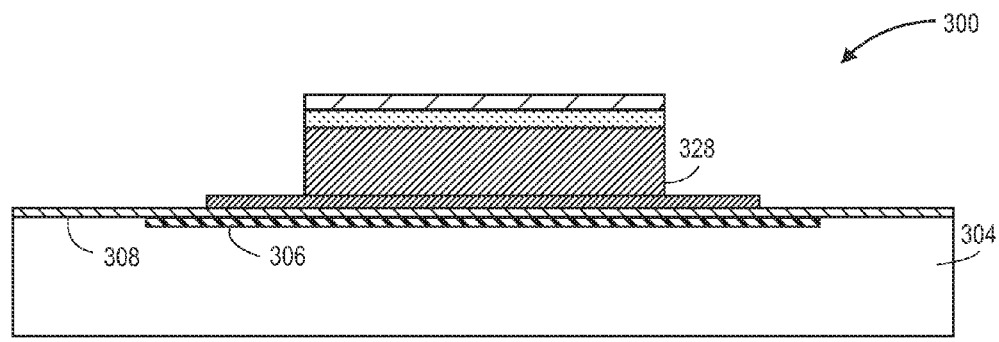
Figure 4G:
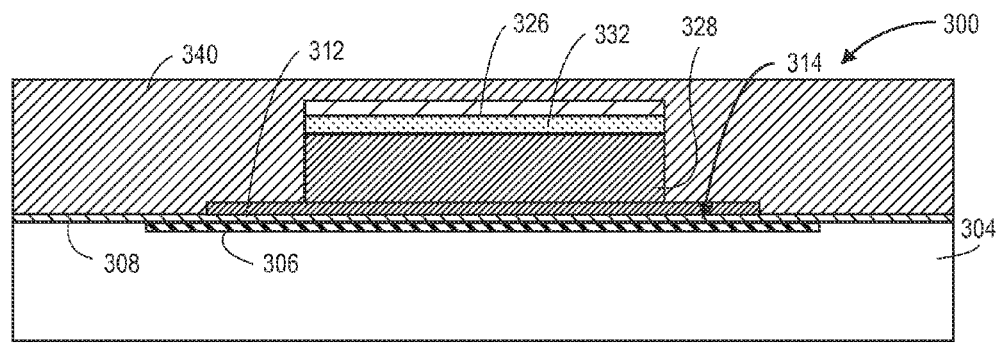

Next, epoxy (polyepoxide) is applied (Block 212) to the wafer. For example, as shown in FIG. 4F, the masks 322 and 324 (FIGS. 4A through 4E) are first removed from the semiconductor wafer 300 exposing the copper posts 328, on which the associated barrier layers 332 and oxidation prevention caps 336 are formed. As shown in FIG. 4G, the epoxy 340 is then applied over the redistribution structure 312 between and over the copper posts 328 (and associated barrier layers 332 and oxidation prevention caps 336), to protect and insulate the redistribution structure 312, and to provide mechanical support to the copper posts 328, barrier layers 332, and oxidation prevention caps 336.

Figure 4H:
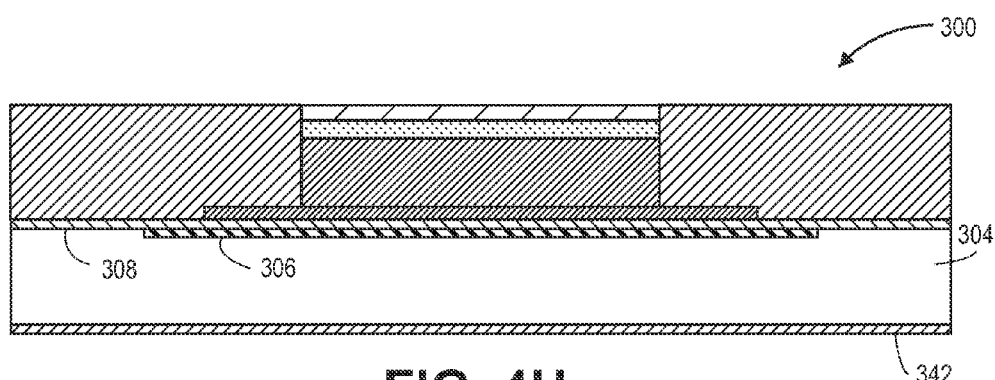
Figure 4I:
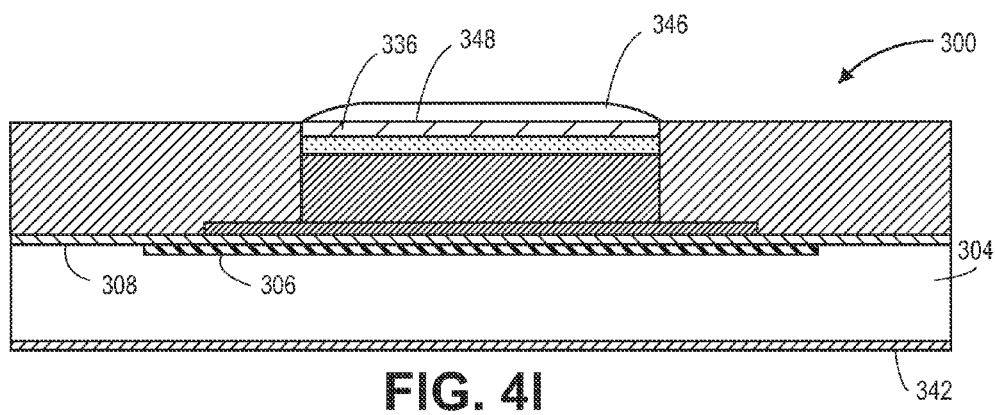

FIG. 4H illustrates the semiconductor wafer 300 following curing and grinding of the epoxy 340, and/or backside coating 342. As shown, an epoxy grinding process has been employed to expose the oxidation prevention cap 336. During epoxy grinding, the oxidation prevention cap 336 may function as a sacrificial layer that may be ground (instead of the nickel of the barrier layer 332) so that the thickness of the barrier layer 332 is not affected. In an example, the epoxy 340 may have a thickness of about 70 μm following epoxy grinding.

The wafer may be thinned (Block 214). For example, the wafer may be subjected to backgrinding or back lapping processes, epoxy grinding processes, and so on. A backside coating may be applied (Block 216) to the surface of the wafer opposite the redistribution structure, which may have been subjected to backgrinding or back lapping processes, to protect the back surface. In one or more embodiments, the backside coating may comprise an epoxy (polyepoxide) applied using deposition techniques such as stencil printing, screen printing, spincoating, and so on. The wafer is further cured (Block 218) to harden the backside coating. The backside coating 342 may have a thickness of about 25 μm. However, the application of epoxy 340 and/or backside coatings 342 having different thicknesses is contemplated.

Next, solder bumps are formed (Block 220) on the oxidation prevention cap of the copper posts. The solder bumps may be formed in a variety of ways. In the implementations described herein, the solder bumps are formed using a ball drop process. Thus, in the following discussion, process operations characteristic of a general ball drop process are described. However, it is contemplated that the specific fabrication processes used may include other process operations without departing from the scope and spirit of the present disclosure. Moreover, it is contemplated that other techniques such as solder paste printing, evaporation, electroplating, jetting, stud bumping, and so on may be used to form the solder bumps.

In a ball drop process, as illustrated in FIG. 3, flux is first applied (Block 222) to the oxidation prevention cap of the copper posts. The flux 346 (illustrated in FIG. 4I) removes oxidation from the surface 348 of the oxidation prevention cap 336, which may be tin or a tin alloy, and holds the solder (e.g., a solder ball 350) to the oxidation prevention cap 336 prior to reflow. The flux 346 may be applied using a variety of application techniques. For example, in one or more embodiments, the flux 346 may be applied using a screen printing process.

Figure 4J:
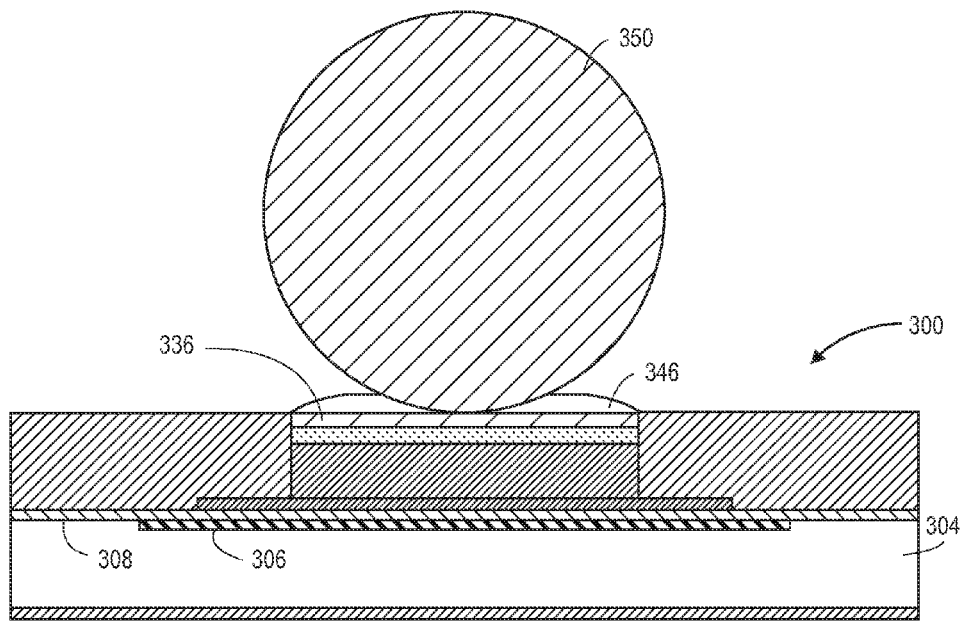

Solder balls (spheres) are then placed (Block 224) onto the flux. Solder balls may be placed on the copper posts of each bump assembly. FIG. 4J illustrates a solder ball 350 affixed to oxidation prevention cap 336 via the flux 346 following removal of the placement stencil.

Figure 4K:
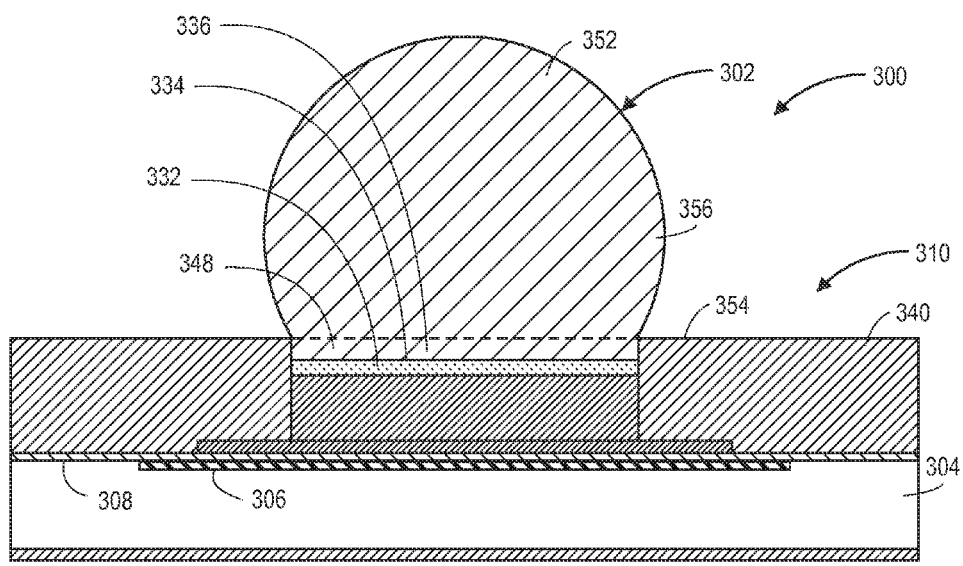

Next, solder reflow is performed (Block 226). During reflow, the wafer is subjected to controlled heat (e.g., via a solder reflow oven), which melts the solder balls, securing the solder to the oxidation prevention cap and/or barrier layer. FIG. 4K illustrates the semiconductor wafer 300 following solder reflow. In FIG. 4K, the solder ball 350 has reflowed to form a solder bump 352 that at least substantially wets the full surface 348 of the oxidation prevention cap 336 and/or barrier layer 332. Residue from the flux 346 (FIG. 4J) following reflow has also been removed. Because the solder contains a high proportion of tin, the tin of the oxidation prevention cap 336 may be at least partially amalgamated with the solder of the solder bump 352. Thus, it is contemplated that, following reflow, a distinct boundary may not exist between the oxidation prevention cap 336 and the solder bump 352.

In implementations, the oxidation prevention cap 336 is deposited over the barrier layer 332 prior to the occurrence of any substantial oxidation of the barrier layer (e.g., oxidation to such an extent that the oxidation substantially affects the strength of the attachment of the oxidation prevention cap 336 to the barrier layer 332 (e.g., tin to nickel), and/or of the oxidation prevention cap 336 to the solder (e.g., SAC to tin) of the solder bumps 352). It is, however, contemplated that some oxidation of the barrier layer 332 may occur prior to application of the oxidation prevention cap 336. Moreover, it is contemplated that oxidation may be removed from the barrier layer 332 prior to application of the oxidation prevention cap 336.

As shown in FIG. 4K, application of the oxidation prevention cap 336 allows the epoxy 340 to extend beyond the outer surface 334 of the barrier layer 332 so that the barrier layer 332 is embedded within the epoxy 340 beneath the oxidation prevention cap 336. In this manner, the oxidation prevention cap 336 and epoxy 340 cooperate to prevent oxygen from reaching the barrier layer metal (e.g., nickel). In an example, the oxidation prevention cap 336 may have a thickness of at least about 5 μm and up to about 15 μm following epoxy backgrinding. Thus, the barrier layer 332 may be embedded beneath the oxidation prevention cap 336 to a depth of at least about 5 μm from the surface 354 of the epoxy 340. As noted, following reflow, the tin of the oxidation prevention cap 336 may become at least partially consumed in a nickel-solder intermetallic compound (IMC) formed between the solder bump 352 and the barrier layer 332. Thus, as shown in FIG. 4K, a portion of the solder bump 352 including the at least partially consumed oxidation prevention cap 336 may extend below the surface 354 of the epoxy 340 so that the epoxy 340 may furnish additional mechanical support to the solder bump 352.

The wafer may then be segmented (e.g., diced) to separate the individual WLP devices (Block 228). In FIG. 4K, the semiconductor wafer 300 is illustrated following the reflow process in preparation of being diced using a segmentation process to form devices such as the WLP devices 100 illustrated in FIGS. 1 and 2.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A WLP device comprising:
an integrated circuit chip; and
a bump assembly formed on the integrated circuit chip, the bump assembly including a copper post having an outer surface, a barrier layer formed on the outer surface to inhibit electromigration in the bump assembly, an oxidation prevention cap formed over the barrier layer, and a solder bump formed on the oxidation prevention cap.

2. The WLP device as recited in claim 1, wherein the barrier layer comprises nickel (Ni).

3. The WLP device as recited in claim 2, wherein the oxidation prevention cap comprises tin (Sn).

4. The WLP device as recited in claim 3, wherein the solder bump comprises solder containing tin (Sn).

5. The WLP device as recited in claim 4, wherein the solder is an SAC solder.

6. The WLP device as recited in claim 4, wherein the tin of the oxidation prevention cap is at least partially consumed in a nickel-solder intermetallic compound formed between the solder bump and the barrier layer.

7. The WLP device as recited in claim 6, wherein the oxidation prevention cap is configured to inhibit oxidation of the barrier layer during fabrication of the bump assembly.

8. An electronic device comprising:
a printed circuit board; and
a WLP device, the waver-level chip-scale package device including an integrated circuit chip having a bump assembly formed thereon for connecting the WLP device to the printed circuit board, the bump assembly including a copper post having an outer surface, a barrier layer formed on the outer surface of the copper post to inhibit electromigration in the bump assembly, an oxidation prevention cap formed over the barrier layer, and a solder bump formed over the tin cap.

9. The electronic device as recited in claim 8, wherein the barrier layer comprises nickel (Ni).

10. The electronic device as recited in claim 9, wherein the oxidation prevention cap comprises tin (Sn).

11. The electronic device as recited in claim 10, wherein the solder bump comprises solder containing tin (Sn).

12. The electronic device as recited in claim 11, wherein the solder comprises an SAC solder.

13. The electronic device as recited in claim 12, wherein the tin of the oxidation prevention cap is at least partially consumed in a nickel-solder intermetallic compound formed between the solder bump and the barrier layer.

14. The electronic device as recited in claim 6, wherein the oxidation prevention cap is configured to inhibit oxidation of the barrier layer during fabrication of the bump assembly.

15. A process comprising:
  forming copper posts on redistribution layer (RDL) pads of a semiconductor wafer configured to be segmented into integrated circuit chips, each of the copper posts having an outer surface;
  applying a barrier layer on the outer surface of each of the copper posts;
  applying an oxidation prevention cap over the barrier layer on each of the copper posts to inhibit oxidation of the barrier layer;
  forming solder bumps on the oxidation prevention caps to form bump assemblies on the semiconductor wafer, and
  segmenting the wafer to separate an integrated circuit chip from the wafer, the integrated circuit chip including at least one bump assembly.

16. The process as recited in claim 15, wherein the application of the barrier layer comprises plating nickel (Ni) on the outer surface of each of the copper posts using an electrolytic process.

17. The process as recited in claim 16, wherein the application of the oxidation prevention caps comprises plating tin (Sn) on the barrier layer.

18. The process as recited in claim 17, further comprising:
  applying a mask to the semiconductor wafer prior to the forming of the copper posts, the mask formed to include apertures that expose the RDL pads; and
  removing the mask following the application of the oxidation prevention caps.

19. The process as recited in claim 17, wherein the forming of the solder bumps comprises:
  applying flux to the oxidation prevention caps;
  placing a solder ball on the flux applied to each oxidation prevention cap; and
  reflowing the solder ball to form the solder bump.

20. The electronic device as recited in claim 17, further comprising:
  thinning the semiconductor wafer following the forming of the oxidation prevention caps; and
  applying a backside coating to the thinned semiconductor wafer.

* * * * *